United States Patent
Kim et al.

(10) Patent No.: US 12,003,228 B2
(45) Date of Patent: Jun. 4, 2024

(54) AIR-GAP TYPE FBAR

(71) Applicant: WISOL CO., LTD., Gyeonggi-do (KR)

(72) Inventors: Byung Hun Kim, Gyeonggi-do (KR); Yong Hun Ko, Gyeonggi-do (KR)

(73) Assignee: WISOL CO., LTD., Gyeonggi-do (KR)

( * ) Notice: Subject to any disclaimer, the term of this patent is extended or adjusted under 35 U.S.C. 154(b) by 488 days.

(21) Appl. No.: 17/338,761

(22) Filed: Jun. 4, 2021

(65) Prior Publication Data

US 2022/0294416 A1   Sep. 15, 2022

(30) Foreign Application Priority Data

Mar. 10, 2021   (KR) .................. 10-2021-0031326

(51) Int. Cl.
*H03H 9/17* (2006.01)
*H03H 9/13* (2006.01)

(52) U.S. Cl.
CPC ............ *H03H 9/173* (2013.01); *H03H 9/13* (2013.01)

(58) Field of Classification Search
CPC ............................... H03H 9/173; H03H 9/13
See application file for complete search history.

(56) References Cited

U.S. PATENT DOCUMENTS

| | | | |
|---|---|---|---|
| 2014/0125203 A1 | 5/2014 | Choy et al. | |
| 2014/0176261 A1* | 6/2014 | Burak | H03H 9/54 333/187 |
| 2015/0349747 A1 | 12/2015 | Burak et al. | |
| 2017/0170233 A1* | 6/2017 | Tsai | H01L 21/8252 |
| 2017/0338799 A1* | 11/2017 | Ruby | H03H 9/171 |
| 2018/0152168 A1* | 5/2018 | Han | H03H 9/02118 |
| 2018/0183406 A1* | 6/2018 | Patil | H03H 9/173 |
| 2018/0309428 A1* | 10/2018 | Lim | H03H 9/173 |

FOREIGN PATENT DOCUMENTS

| | | |
|---|---|---|
| KR | 10-2004-0102390 A | 12/2004 |
| KR | 10-2016-0015628 A | 2/2016 |
| KR | 10-2018-0006261 A | 1/2018 |
| KR | 20190058258 A | 5/2019 |
| KR | 10-2021-0132324 A | 11/2021 |

OTHER PUBLICATIONS

Office Action from corresponding Korean Patent Application No. 10-2021-0031326 dated Aug. 12, 2021.
Office Action from corresponding Korean Patent Application No. 10-2021-0132324, dated Jan. 11, 2024.

* cited by examiner

*Primary Examiner* — Bryan P Gordon
(74) *Attorney, Agent, or Firm* — Harness, Dickey & Pierce, P.L.C.

(57) ABSTRACT

An air-gap type film bulk acoustic resonator (FBAR) according to the present invention may include: a substrate comprising an air gap portion on an upper surface thereof; a lower electrode formed on the substrate; a piezoelectric layer formed on the lower electrode; an upper electrode formed on the piezoelectric layer; a protective layer formed on the upper electrode; and a beam structure extended in a dome shape from one side of the upper electrode to define a space portion between the upper electrode and the piezoelectric layer, wherein one end of the beam structure is in contact with the piezoelectric layer.

14 Claims, 6 Drawing Sheets

AIR-GAP TYPE FBAR

CROSS-REFERENCE TO RELATED APPLICATION

This application claims the benefit under 35 USC § 119(a) of Korean Patent Application No. 10-2021-0031326, filed on Mar. 10, 2021, in the Korean Intellectual Property Office, the entire disclosure of which is incorporated herein by reference for all purposes.

FIELD

The following description relates to a film bulk acoustic resonator (FBAR) for use in a filter and duplexer for communication in the radio frequency (RF) band, more particularly, to an air-gap type FBAR.

BACKGROUND

Mobile communication technologies require diverse radio frequency (RF) parts that can efficiently transfer information in a limited frequency bandwidth. In particular, the filter of the RF parts is one of the key elements in mobile communication technologies. This filter serves to filter innumerable waves in air to allow users to select or transfer desired signals, thereby enabling high-quality communications.

Currently, wireless communication RF filters are typically dielectric filters or surface acoustic wave (SAW) filters. A dielectric filter provides high dielectric permittivity, low insertion loss, stability at high temperatures, and is robust to vibration and shock. However, the dielectric filter has limitations in small-sizing and application to monolithic microwave integrated circuit (MMIC) which are recent trends in the technology development. On the other hand, a SAW filter provides a small size, facilitates processing signals, has a simplified circuit, and can be mass-produced using semiconductor processes. Further, the SAW filter provides a high side rejection in a passband compared to the dielectric filter, allowing it to transmit and receive high-quality information. However, using conventional interDigital transducers (IDTs) for a SAW filter limits its line width, since the process for creating such a SAW filter includes exposure to ultraviolet (UV) light. Currently, such a SAW filter's line width is limited to about 0.5 µm. Accordingly, the SAW filter cannot cover the high frequency bands, e.g., over 5 GHz. Further, it is still difficult to integrate a SAW filter with the MMIC structure on a semiconductor substrate as a single chip.

In order to overcome the limits and problems as above, a film bulk acoustic resonance (FBAR) filter has been proposed in which a frequency control circuit can be completely constructed in the form of MMIC with other active devices integrated together on an existing Si or GaAs semiconductor substrate.

The FBAR is a thin film device that is low-priced, small-sized, and can be designed to have a high-Q factor. Thus, the FBAR filter can be used in wireless communication equipment of various frequency bands, for example, ranging from 900 MHz to 10 GHz and military radar. The FBAR can be made an order of magnitude smaller than a dielectric filter or a lumped constant (LC) filter and has a very low insertion loss compared to the SAW filter. The FBAR can be integrated with the MMIC while providing a filter having a high stability and a high-Q factor. The FBAR may be the most adequate element for the MMIC that requires a high stability and a high-Q factor.

The FBAR filter includes a piezoelectric dielectric material such as ZnO, AlN, or any appropriate material having a high acoustic velocity. The piezoelectric material may be directly deposited onto a Si or GaAs semiconductor substrate, e.g., by RF sputtering. The resonance of the FBAR filter arises from the piezoelectric characteristics of the piezoelectric material used therein. More particularly, the FBAR filter includes a piezoelectric film disposed between two electrodes, and generates bulk acoustic waves to induce resonance.

FBAR structure has been studied in variety of ways to date. In case of a membrane type FBAR, silicon oxide film ($SiO_2$) is deposited on a substrate, and a membrane layer is formed on the opposite side of the substrate through a cavity formed by isotropic etching. Next, a lower electrode is formed on the upper part of the silicon oxidation film, a piezoelectric material is deposited on the upper part of lower electrode by a RF magnetron sputtering method to form a piezoelectric layer, and an upper electrode is formed on the upper part of the piezoelectric layer.

The above membrane type FBAR provides a low dielectric loss of the substrate and less power loss due to the cavity. However, the membrane type FBAR occupies a large area due to the orientation of the silicon substrate, and is easily damaged due to the low structural stability upon a subsequent packaging process, resulting in low yield. Accordingly, recently, air gap-type and Bragg reflector-type FBARs have been created to reduce the loss due to the membrane and simplify the device manufacturing process.

The Bragg reflector-type FBAR is formed by vapor-depositing in order of a reflection layer, a lower electrode, a piezoelectric layer, and an upper electrode. Here, the reflection layer is formed by vapor-depositing on a substrate materials having a large difference of elastic impedance in an alternate manner. Thus-structured Bragg reflector-type FBAR elements can effectively generate the resonance since all elastic acoustic wave energy passed through the piezoelectric layer is not transferred to the substrate, but reflected at the reflection layer. The Bragg reflector-type FBAR has a firm structure without a stress from bending, however, it is hard to form the reflection layer of at least 4 layers in precise thickness for total reflection. Additionally, a significant amount of manufacturing time and a large cost are required.

On the other hand, the conventional air gap-type FBAR having a structure that uses an air gap instead of the reflection layer to separate the substrate from the resonance part is fabricated as follows. A sacrificial layer is formed by isotropically etching a surface of a silicon substrate, and the substrate is subjected to chemical-mechanical polishing (CMP). Then, an insulation layer, a lower electrode, a piezoelectric layer, and an upper electrode are vapor-deposited in order, and then the sacrificial layer is removed through a via hole to form an air gap.

In the conventional FBAR structure, the piezoelectric layer is formed between the upper and lower electrodes, and the upper and lower electrodes are provided only in areas where the piezoelectric layer is required to provide the piezo effect. Therefore, the mechanical anchor loss is large, which may cause mechanical energy reduction.

The upper electrode or the lower electrode uses Mo, Ru, W, etc. to increase the acoustic impedance. The skin depth of an electrode material is determined according to the frequency of the filter. Generally, the thickness of the electrode is much smaller than the skin depth, and thus electric charges charged at the resonance point of the piezoelectric layer cannot be sufficiently transferred through the lead, leading to a decrease in quality factor.

PRIOR ART DOCUMENT

Patent Document (Patent Document 0001) Korean Patent Laid-Open Publication No. 10-2004-0102390 (published on Dec. 8, 2004)

SUMMARY

This summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

The following description relates to an air-gap type film bulk acoustic resonator (FBAR) capable of improving resonance characteristics.

In one general aspect of the present invention, an air-gap type FBAR includes: a substrate including an air gap portion on an upper surface thereof; a lower electrode formed on the substrate; a piezoelectric layer formed on the lower electrode; an upper electrode formed on the piezoelectric layer; a protective layer formed on the upper electrode; and a beam structure extended in a dome shape from one side of the upper electrode to define a space portion between the upper electrode and the piezoelectric layer, wherein one end of the beam structure is in contact with the piezoelectric layer.

The beam structure may be formed above the air gap portion with respect to a vertical virtual surface extending from a gap edge of the air gap portion.

The space portion may be filled with one of air and SiO2 whose density is lower than the density of a material constituting the upper electrode or the piezoelectric layer.

A width of the one end of the beam structure in contact with the piezoelectric layer may be 100 nm to 200 nm.

The one end of the beam structure may include a first end in contact with the piezoelectric layer by a predetermined width and a second end extending in a diagonal direction from the first end.

An end of the protective layer may protrude beyond an end of the beam structure by a predetermined length.

The air-gap type FBAR may further include a conductive metal pattern layer deposited at a position a predetermined distance apart from the one end of the beam structure.

A structure groove may be formed on a lower surface of the beam structure that corresponds to an upper portion of the space portion.

A piezoelectric groove may be formed on an upper surface of the piezoelectric layer that corresponds to a lower portion of the space portion.

A lower portion of the space portion may include a tilted portion of an upper surface of the piezoelectric layer.

A lower electrode edge corresponding to one end of the lower electrode may be positioned inside an upper surface of the air gap portion.

Other features and aspects will be apparent from the following detailed description, the drawings, and the claims.

Throughout the drawings and the detailed description, unless otherwise described, the same drawing reference numerals will be understood to refer to the same elements, features, and structures. The relative size and depiction of these elements may be exaggerated for clarity, illustration, and convenience.

DETAILED DESCRIPTION

Hereinafter, exemplary embodiments of the present invention will be described in detail with reference to the attached drawings.

The embodiments of the present invention are provided to more completely explain the present invention to one of ordinary skill in the art. The following embodiments may be modified into a variety of different forms, and the scope of the present invention is not limited thereto. The embodiments are provided to make the disclosure more substantial and complete and to completely convey the concept of the present invention to those skilled in the art.

The terms used herein are to explain particular embodiments and are not intended to limit the present invention. As used herein, singular forms, unless contextually defined otherwise, may include plural forms. Also, as used herein, the term "and/or" includes any and all combinations or one of a plurality of associated listed items. Hereinafter, the embodiments of the present invention will be described with reference to the drawings which schematically illustrate the embodiments.

Figure 1:
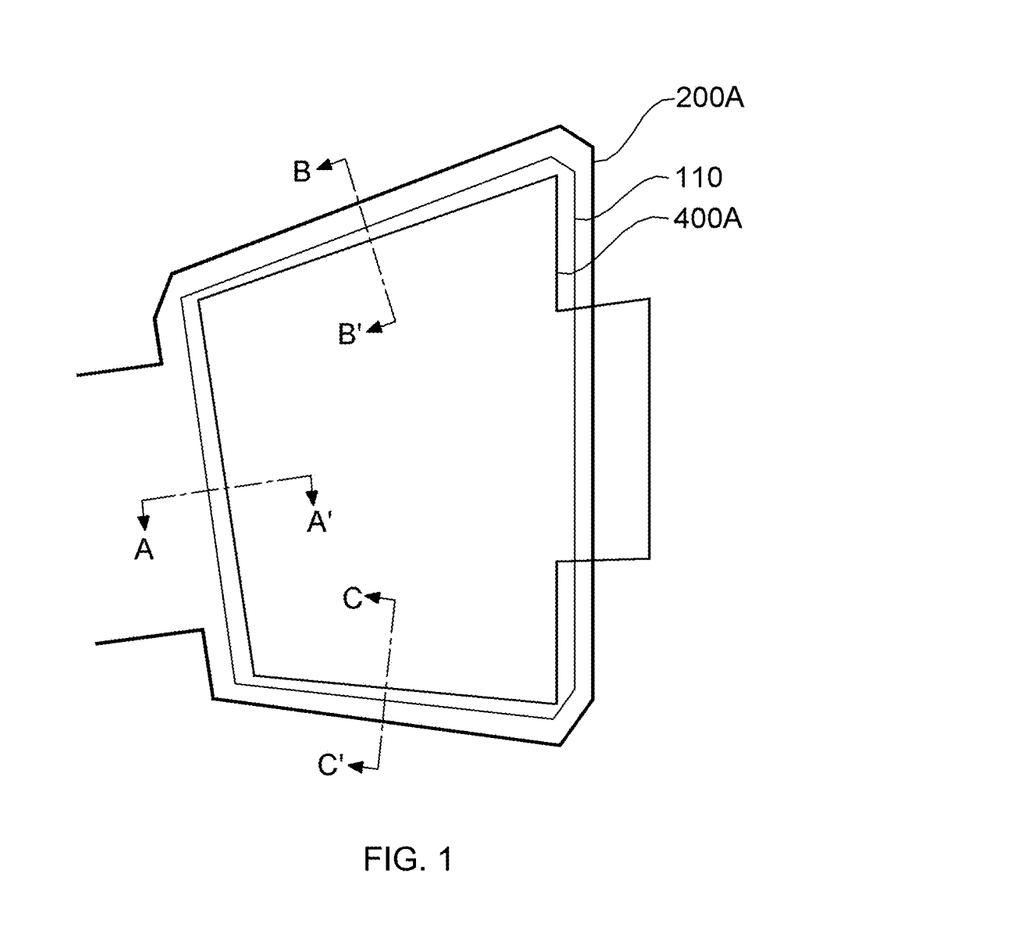
FIG. 1 is a plan view of an air-gap type film bulk acoustic resonator (FBAR) according to one embodiment of the present invention.
Figure 2:
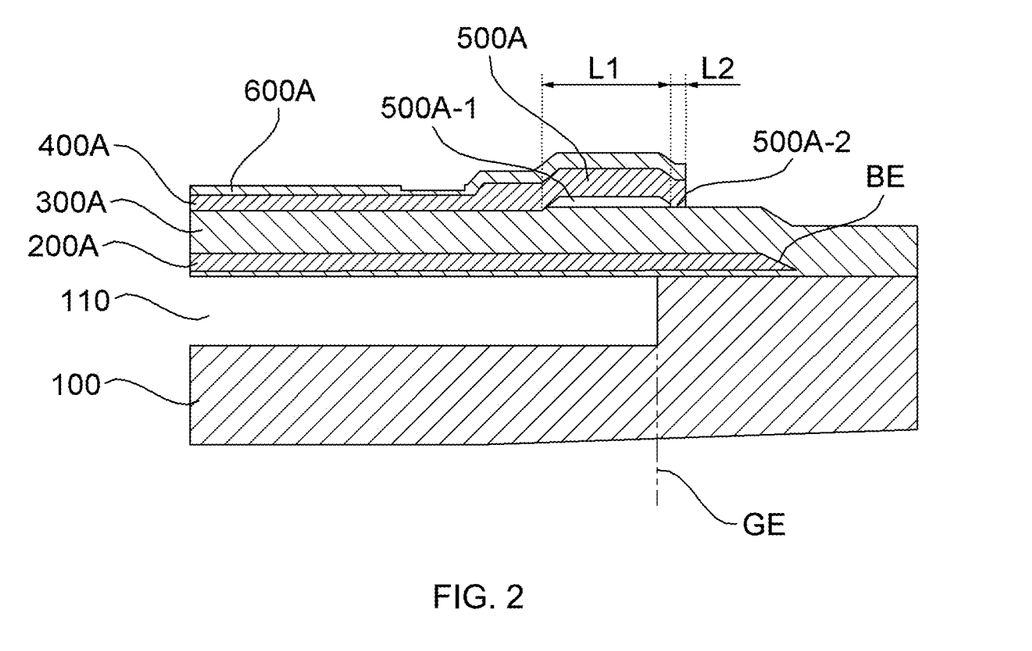
FIG. 2 is a vertical cross-sectional view of an area AA', BB' or CC' of the air-gap type FBAR shown in FIG. 1.

FIG. 1 is a plan view of an air-gap type film bulk acoustic resonator (FBAR) according to one embodiment of the present invention, and FIG. 2 is a vertical cross-sectional view of an area AA', BB' or CC' of the air-gap type FBAR shown in FIG. 1. Like reference numerals used herein refer to like elements having the same or similar function or structure.

Referring to FIG. 2, the air-gap type FBAR includes a substrate 100, an air gap portion 110, a lower electrode 200A, a piezoelectric layer 300A, an upper electrode 400A, a beam structure 500A, and a protective layer 600A.

In the air-gap type FBAR, when a signal is applied from the outside to a space between the lower electrode 200A and the upper electrode 400A, a part of the electrical energy input to the space between the two electrodes is converted into mechanical energy according to the piezoelectric effect. In the process of converting the mechanical energy back into electrical energy, resonance occurs with respect to the frequency of natural vibration depending on the thickness of the piezoelectric layer 300A.

The substrate 100, which is a semiconductor substrate, may be a general silicon wafer, and preferably a high resistance silicon substrate (HRS). An insulating layer (not shown) may be formed on an upper surface of the substrate 100. As the insulating layer, a thermal oxide film that can be easily grown on the substrate 100 may be employed, or an oxide film or a nitride film using a conventional deposition process, such as chemical vapor deposition, may be optionally employed.

The air gap portion 110 is formed as follows. After a cavity is formed in the substrate 100, an insulation layer is formed in the cavity, a sacrificial layer is deposited on the insulation layer and then planarized by etching, and then the sacrificial layer is removed to form the air gap portion 110. Here, the sacrificial layer is made of a material, such as polysilicon or ZnO, that has excellent surface roughness and allows easy formation and removal of the sacrificial layer. For example, tetraethyl orthosilicate (TEOS) or polysilicon may be used as a sacrificial layer. TEOS or polysilicon has excellent surface roughness and easy to form and remove. Particularly, the sacrificial layer may be removed by applying dry etching following process.

The lower electrode 200A is formed on the substrate 100 in which the sacrificial layer is present in the air gap portion 110. The lower electrode 200A is formed by depositing a predetermined material on the substrate 100 and then patterning it. The material used for the lower electrode 200A is a general conductive material, such as metal, and preferably, may be one of aluminum (Al), tungsten (W), gold (Au), platinum (Pt), nickel (Ni), titanium (Ti), chromium (Cr), palladium (Pd), molybdenum (Mo). The thickness of the lower electrode 200 may be 10 nm to 1000 nm.

The lower electrode 200A may be formed on the insulating layer and the sacrificial layer of the substrate 100 by patterning. The lower electrode 200A is formed above the air gap part 110 of the substrate 100 and may have a shape surrounding the entire upper part of the air gap part 110. In this case, a lower electrode edge BE corresponding to one end of the lower electrode 200A may be formed to be spaced apart from a gap edge GE of the air gap portion 110 by a predetermined distance or more. In this case, the lower electrode edge BE formed on the substrate 100 may be formed to be tilted in a diagonal direction.

The piezoelectric layer 300A is formed on the lower electrode 200A. The piezoelectric layer 300A may be formed by depositing a piezoelectric material on the lower electrode 200A and then patterning it. As a general piezoelectric material, aluminum nitride (AlN) or zinc oxide (ZnO) may be used. As for the deposition method, a radio frequency (RF) magnetron sputtering method, an evaporation method, and the like are used. The thickness of the piezoelectric layer 300A may be 5 nm to 500 nm.

The upper electrode 400A is formed on the piezoelectric layer 300A. The upper electrode 400A may be formed by depositing and patterning a metal film for an upper electrode on the piezoelectric layer 300A. The upper electrode 400A may use the same material, the same deposition method, and the same patterning method as those of the lower electrode 200A. The thickness of the upper electrode 400A may be 5 nm to 1000 nm. At the end of the upper electrode 400A, a raised frame that is thicker than the active region is formed around the resonator, which purpose is to decrease vibration mode in the lateral direction, thereby increasing the Q value.

The beam structure 500A is extended in a dome shape from one side of the upper electrode 400A to define a space portion 500A-1 between the upper electrode 400A and the piezoelectric layer 300A. At this time, one end 500A-2 of the beam structure 500A is in contact with or deposited on the piezoelectric layer 300A.

As shown in FIG. 2, the beam structure 500A includes regions represented by length L1 and length L2, respectively. The region of the beam structure 500A represented by length L1 has a dome shape.

The one end 500A-2 of the beam structure 500A corresponds to the edge frame of the beam structure 500A, and may be positioned above the air gap portion 110 with respect to a vertical virtual surface extending from the gap edge GE of the air gap portion 110. As the one end 500A-2 of the beam structure 500A is in contact with or deposited on the piezoelectric layer 300A, it serves to block energy flowing out to the side surface.

In addition, as shown in FIG. 2, the length 2 of the width of the one end 500A-2 of the beam structure 500A in contact with or deposited on the piezoelectric layer 300A may be preferably 50 nm to 200 nm. In this case, as the length L2 of the width of the one end 500A-2 in contact with the piezoelectric layer 300A increases, the performance of the Q value may decrease. However, the structure in which the one end 500A-2 is in contact with the piezoelectric layer 300A is superior to the structure in which the end is not in contact with the piezoelectric layer 300A in terms of performance and robustness.

The space portion 500A-1 is a space formed between a lower surface of the beam structure 500A and an upper surface of the piezoelectric layer 300A. The space part 500A-1 may be filled with one of air and $SiO_2$ whose density is lower than the density of the material constituting the upper electrode 400A or the piezoelectric layer 300A.

After depositing the sacrificial layer on the piezoelectric layer 300A, a conductive material for forming the upper electrode 400A and the beam structure 500A is deposited on the piezoelectric layer 300a including the sacrificial layer, and thereafter, the sacrificial layer is removed to form the beam structure 500A. Here, the sacrificial layer is made of a material, such as polysilicon, tetraethyl orthosilicate (TEOS), or phophosilicate glass (PSG), which has excellent surface roughness and allows easy formation and removal of the sacrificial layer. Further, the beam structure 500A may be formed by depositing $SiO_2$ instead of the sacrificial layer, and then depositing a conductive material.

The height of the space portion 500A-1 may be less than ½ of the thickness of the upper electrode 400A. The thickness of the upper electrode 400A may be varied for each region by the beam structure 500A. By making the height of the space portion 500A-1 less than ½ of the thickness of the upper electrode 400A, it is possible to ensure the minimum thickness such that heat generated inside can easily escape. In addition, the length L1 of the horizontal width of the space portion 500A-1 may be 1 μm to 5 μm.

The beam structure 500A may be formed around a virtual surface vertically extending from the gap edge GE of the air gap unit 110. In particular, as shown in FIG. 2, the beam structure 500A may be formed above the air gap portion 110 with respect to the vertical virtual surface extending from the gap edge GE of the air gap part 110. Accordingly, the beam structure 500A may block energy flowing out to the side portion.

In the beam structure 500A, a vertical cross-sectional structure of the space portion 500A-1 forming a dome-shaped space may have a trapezoidal structure. Referring to FIG. 2, the vertical cross-sectional structure of the space portion 500A-1 has a quadrangular structure, which is, more specifically, a trapezoidal structure in which the horizontal width of the lower surface is longer than the horizontal width of the upper surface. However, the trapezoidal structure is exemplary, and the upper surface may have a curved shape rather than a horizontal surface.

The protective layer 600A is formed on the upper electrode 400A and the beam structure 500A. The protective layer 600A serves as a cover for covering and protecting the lower electrode 200A, the piezoelectric layer 300A, the upper electrode 400A, and the beam structure 500A. The protective layer 600A has one end corresponding to the one end 500A-2 of the beam structure 500A. As shown in FIG. 2, a recessed frame is formed by reducing the thickness of the protective layer ahead of the leading end of the raised frame. The recessed frame serves to reduce a spurious mode that occurs in the frequency range of 50 to 60 MHz. A spurious mode typically occurs in a bulk acoustic wave (BAW) resonator shortly before a resonance frequency. This recessed frame may also be implemented on the upper electrode.

Figure 3:
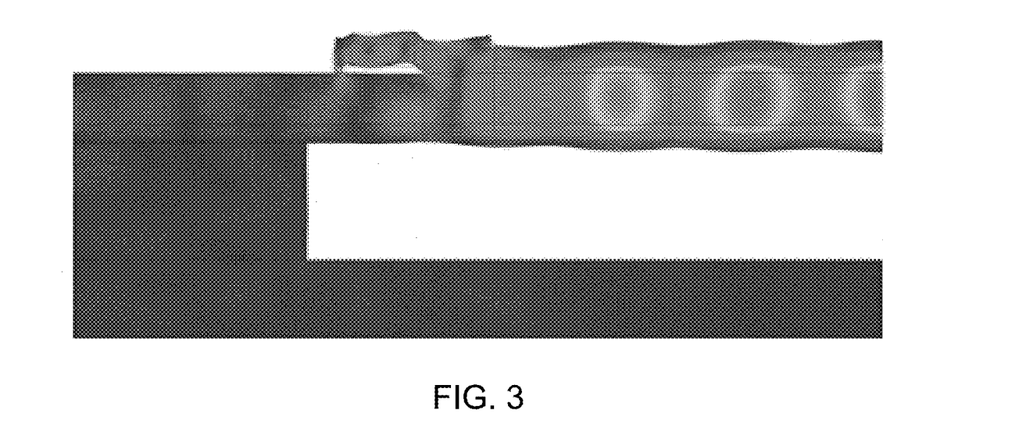
FIG. 3 is a reference diagram showing an operating state of the air-gap type FBAR shown in FIG. 2.
Figure 4:
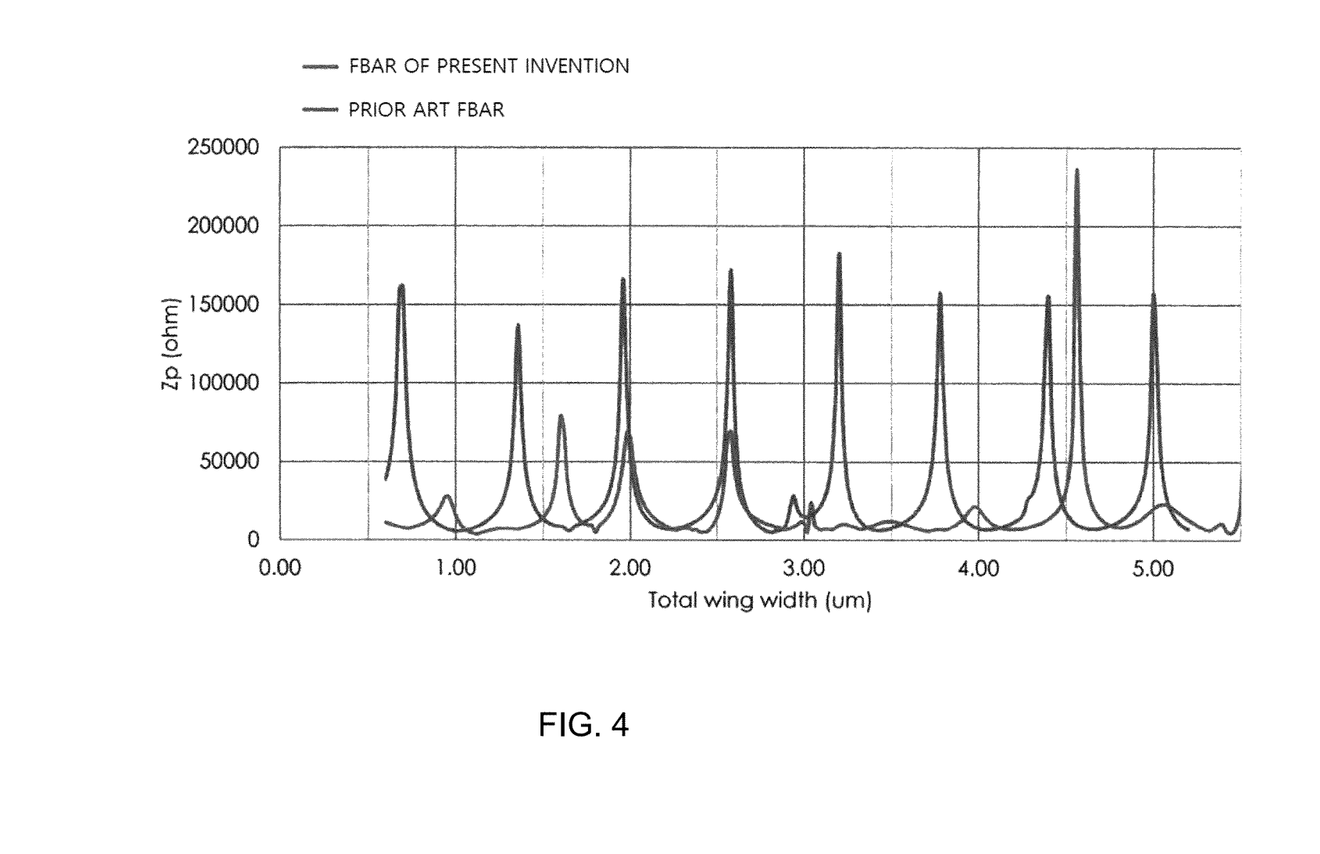
FIG. 4 is a graph for describing performance characteristics of the air-gap type FBAR shown in FIG. 2.

FIG. 3 is a reference diagram showing the operating state of the air-gap type FBAR shown in FIG. 2, and FIG. 4 is a graph for describing the performance characteristics of the air-gap type FBAR shown in FIG. 2.

The horizontal axis of the graph shown in FIG. 4 represents the total length (L1+L2) of the entire region constituting the beam structure 500A, and the vertical axis represents a Q value. Referring to FIG. 4, as compared to a prior art, the configuration in which the beam structure 500A is extended from the upper electrode 400A has the highest Q value when the length of the space portion 500A-1 is near 4.5 μm. However, even when the length of the space portion 500A-1 is 2.0 μm, a higher Q value than that of a conventional cantilever-type FBAR is obtained.

Figure 5:
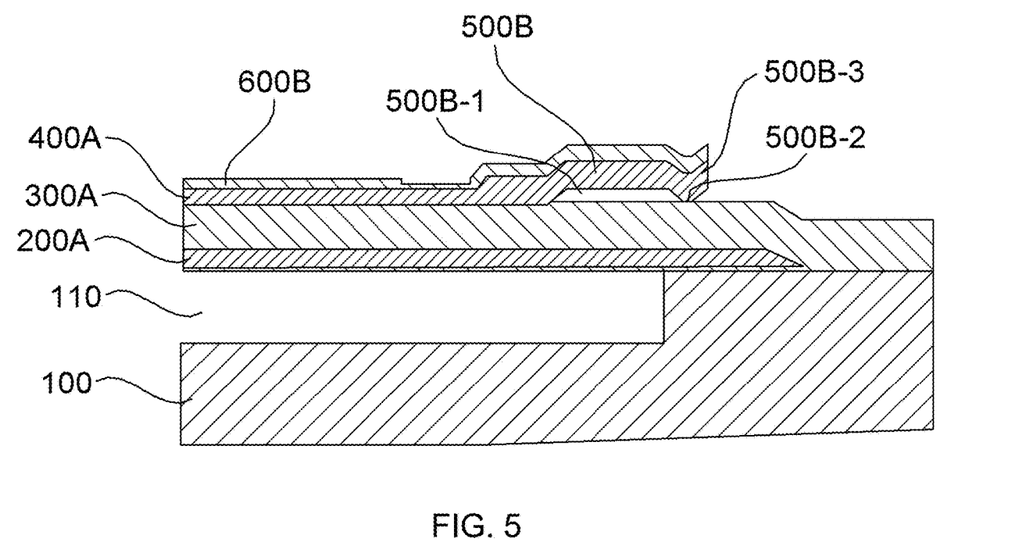
FIG. 5 is a cross-sectional view of an air-gap type FBAR according to another embodiment of the present invention.

FIG. 5 is a cross-sectional view of an air-gap type FBAR according to another embodiment of the present invention.

Referring to FIG. 5, the air-gap type FBAR includes a substrate 100, an air gap portion 110, a lower electrode 200A, a piezoelectric layer 300A, an upper electrode 400A, a beam structure 500A, and a protective layer 600B. Elements in FIG. 5 referred to by the same reference numerals as those in FIG. 2 will not be described in detail, and the following description will focus on other elements that are different from those in FIG. 2.

The beam structure 500B is extended in a dome shape from one side of the upper electrode 400A to define a space portion 500B-1 between the upper electrode 400A and the piezoelectric layer 300A. In this case, one end 500A-2 of the beam structure 500A is in contact with or deposited on the piezoelectric layer 300A.

One end of the beam structure 500B has a first end 500B-2 in contact with the piezoelectric layer 300A by a predetermined width, and a second end 500B-3 extending diagonally upward from the first end 500B-2.

The length of the first end 500B-2 may be preferably 100 nm to 200 nm. In addition, the second end 500B-3 extends upward at a predetermined inclination angle with respect to the horizontal plane, and a Q value may be improved due to the second end 500B-3.

The protective layer 600B is formed on the upper electrode 400A and the beam structure 500A. The protective layer 600B serves as a cover for at least partially covering and protecting the lower electrode 200A, the piezoelectric layer 300A, the upper electrode 400A, and the beam structure 500A. The protective layer 600B extends in a diagonal direction corresponding to the first end 500B-2 and the second end 500B-3 that are one end of the beam structure 500B.

Figure 6:
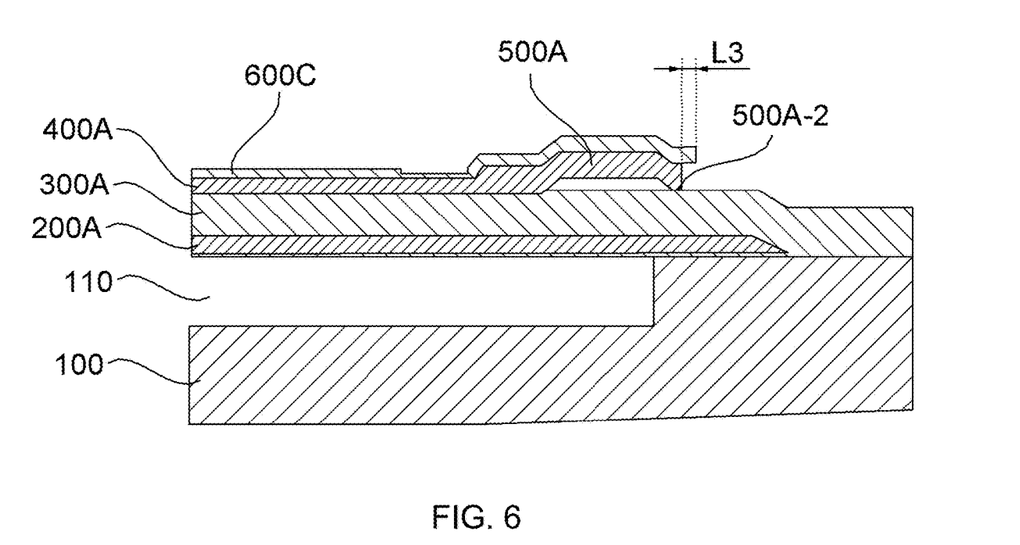
FIG. 6 is a cross-sectional view of an air-gap type FBAR according to still another embodiment of the present invention.

FIG. 6 is a cross-sectional view of an air-gap type FBAR according to still another embodiment of the present invention.

Referring to FIG. 6, the air-gap type FBAR includes a substrate 100, an air gap portion 110, a lower electrode 200A, a piezoelectric layer 300A, an upper electrode 400A, a beam structure 500A, and a protective layer 600C. Elements in FIG. 6 referred to by the same reference numerals as those in FIG. 2 will not be described in detail, and the following description will focus on other elements that are different from those in FIG. 2.

An end of the protective layer 600C may protrude beyond one end 500A2 of the beam structure 500A by a predetermined length L3. By forming the end of the protective layer 600C to protrude beyond the one end 500A-2 of the beam structure 500A, the Q value may be improved.

Figure 7:
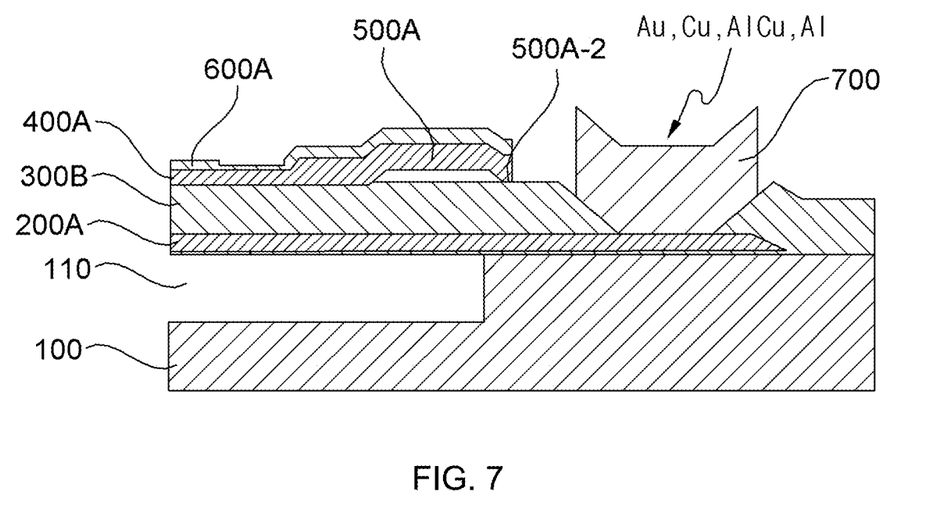
FIG. 7 is a cross-sectional view of an air-gap type FBAR according to yet another embodiment of the present invention.

FIG. 7 is a cross-sectional view of an air-gap type FBAR according to yet another embodiment of the present invention.

Referring to FIG. 7, the air-gap type FBAR includes a substrate 100, an air gap portion 110, a lower electrode 200A, a piezoelectric layer 300B, an upper electrode 400A, a beam structure 500A, a protective layer 600A, and a metal pattern layer 700.

The piezoelectric layer 300B is deposited on the lower electrode 200A. The piezoelectric layer 300B does not surround the entire area of the lower electrode 200A, but is deposited so that a part of the lower electrode 200A is exposed. At this time, the metal pattern layer 700 is formed on an area where the piezoelectric layer 300B is not deposited.

The metal pattern layer 700 is made of a conductive metal material and is formed around an air-gap type FBAR at a position a predetermined distance apart from one end 500A-2 of the beam structure 500A. Here, the metal forming the metal pattern layer 700 includes gold (Au), copper (Cu), aluminum (Al), aluminum copper alloy (AlCu), and the like. By forming the metal pattern layer 700, the Q value may be further improved.

Figure 8:
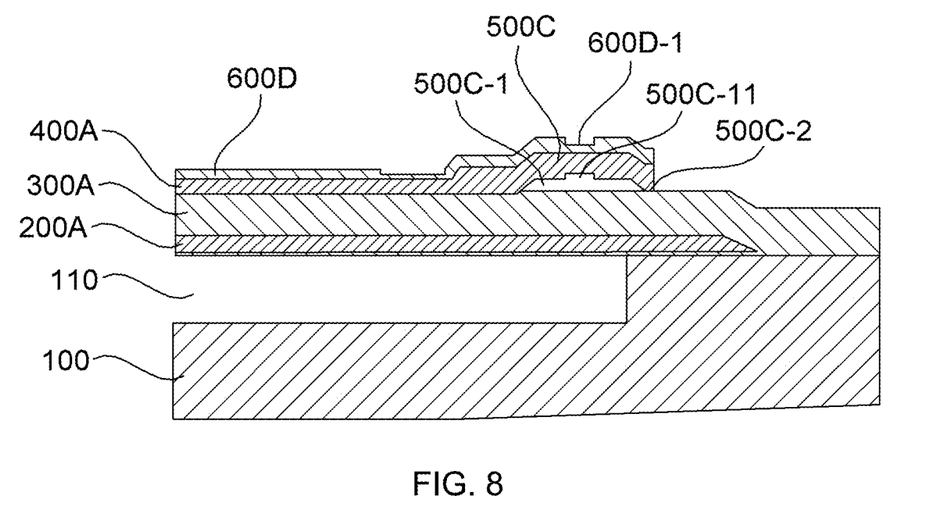
FIG. 8 is a cross-sectional view of an air-gap type FBAR according to another embodiment of the present invention.

FIG. 8 is a cross-sectional view of an air-gap type FBAR according to another embodiment of the present invention.

Referring to FIG. 8, the air-gap type FBAR includes a substrate 100, an air gap portion 110, a lower electrode 200A, a piezoelectric layer 300A, an upper electrode 400A, a beam structure 500C, and a protective layer 600D.

The beam structure 500C is extended in a dome shape from one side of the upper electrode 400A to define a space portion 500C-1 between the upper electrode 400A and the piezoelectric layer 300A. In this case, one end 500C-2 of the beam structure 500C is in contact with or deposited on the piezoelectric layer 300A.

A structure groove 500C-11 is formed on a lower surface of the beam structure 500C that corresponds to an upper portion of the space part 500C-1. The structure groove 500C-11 corresponds to an upper protruding portion of the space portion 500C-1.

The protective layer 600D is formed on the upper electrode 400A and the beam structure 500A. An upper surface of the protective layer 600D may have a protective layer groove 600D-1 formed at a position symmetrical to the structure groove 500C-11 of the beam structure 500C. By forming the structure groove 500C-11 and the protective layer groove 600D-1, the Q value may be improved.

Figure 9:
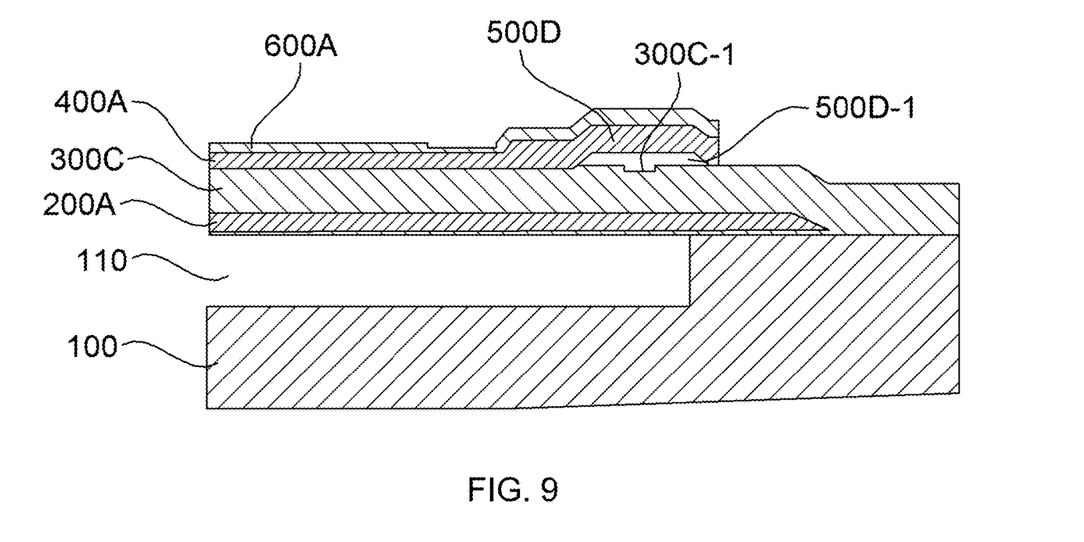
FIG. 9 is a cross-sectional view of an air-gap type FBAR according to another embodiment of present invention.

FIG. 9 is a cross-sectional view of an air-gap type FBAR according to another embodiment of the present invention.

Referring to FIG. 9, the air-gap type FBAR includes a substrate 100, an air gap portion 110, a lower electrode 200A, a piezoelectric layer 300C, an upper electrode 400A, a beam structure 500D, and a protective layer 600A.

The piezoelectric layer 300C is formed on the lower electrode 200A. In this case, a piezoelectric groove 300C-1 is formed on an upper surface of the piezoelectric layer 300C that corresponds to a lower portion of the beam structure 500D. The piezoelectric groove 300C-1 corresponds to a lower protruding portion of the beam structure 500D.

The beam structure 500D includes a space portion 500D-1 formed between upper and lower surfaces of the piezoelectric layer 300C. The space portion 500D-1 may be formed in the piezoelectric layer 300C having the piezoelectric groove 300C-1 formed thereon. By forming the piezoelectric groove 300C-1, the Q value may be improved.

Figure 10:
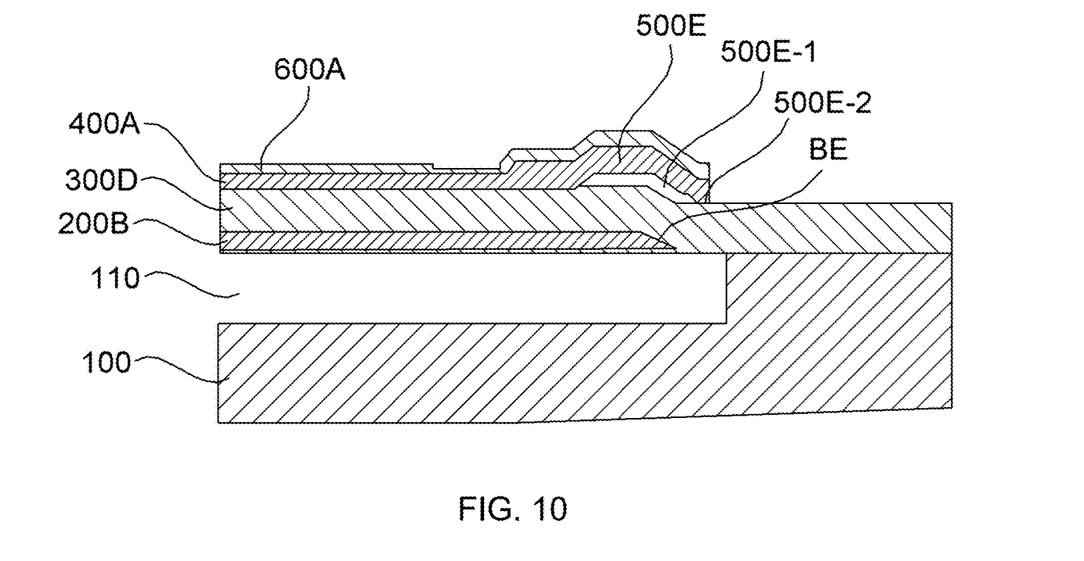
FIG. 10 is a cross-sectional view of an air-gap type FBAR according to another embodiment of the present invention.

FIG. 10 is a cross-sectional view of an air-gap type FBAR according to another embodiment of the present invention.

Referring to FIG. 10, the air-gap type FBAR includes a substrate 100, an air gap portion 110, a lower electrode 200B, a piezoelectric layer 300D, an upper electrode 400A, a beam structure 500E, and a protection layer 600A.

The lower electrode 200B is formed on the substrate 100 in which a sacrificial layer is present in the air gap portion 110. In this case, a lower electrode edge BE corresponding to one end of the lower electrode 200B may be formed to be spaced apart from a gap edge GE of the air gap portion 110 by a predetermined distance or more, and may be positioned inside an upper surface of the air gap portion 110. The lower electrode edge BE formed on the substrate 100 may be formed to be tilted in a diagonal direction.

The piezoelectric layer 300D is formed on the lower electrode 200B. In this case, the piezoelectric layer 300D is formed to be tilted to correspond to an inclined surface of the lower electrode edge BE of the lower electrode 200B, and the height of the piezoelectric layer 300D varies accordingly.

The beam structure 500E is extended in a dome shape from one side of the upper electrode 400A to define a space portion 500E-1 between the upper electrode 400A and the piezoelectric layer 300D. In this case, one end 500E-2 of the beam structure 500E is in contact with or deposited on one end of the piezoelectric layer 300D at a different height.

At this time, a lower portion of the space portion 500E-1 includes a tilted portion of the upper surface of the piezoelectric layer 300D. As the lower portion of the space portion 500E-1 includes an inclined structure, the Q value may be improved.

The air-gap type FBAR as described above has a structure in which an RF signal input to the upper electrode 400 is output to the lower electrode 200 through the piezoelectric layer 300. At this time, since the piezoelectric layer 300 has a constant resonance frequency, only an RF signal that has a frequency coincident with the frequency of the piezoelectric layer 300 among the input RF signals is output and the other frequencies are extinguished. Accordingly, the lower electrode 200, the piezoelectric layer 300, and the upper electrode 400 are configured as described above such that an FBAR filter having a constant center frequency and bandwidth may be implemented.

According to the present invention, a substrate, a lower electrode, a piezoelectric layer, and an upper electrode are provided, and a beam structure that defines a space portion between a lower surface at one end of the upper electrode and an upper surface of the piezoelectric layer is also included, wherein one end of the beam structure is in contact with the piezoelectric layer. Accordingly, a lateral wave escaping from an active region may be prevented, thereby improving the quality factor.

A number of examples have been described above. Nevertheless, it will be understood that various modifications may be made. For example, suitable results may be achieved if the described techniques are performed in a different order and/or if components in a described system, architecture, device, or circuit are combined in a different manner and/or replaced or supplemented by other components or their equivalents. Accordingly, other implementations are within the scope of the following claims.

What is claimed is:

1. An air-gap type film bulk acoustic resonator (FBAR) comprising:
    a substrate comprising an air gap portion on an upper surface thereof;
    a lower electrode formed on the substrate;
    a piezoelectric layer formed on the lower electrode;
    an upper electrode formed on the piezoelectric layer; and
    a beam structure comprising a protective layer formed on the upper electrode and extending in a dome shape from one side of the upper electrode to define a space portion between the upper electrode and the piezoelectric layer,
    wherein one end of the beam structure is in contact with the piezoelectric layer, and
    wherein an end of the protective layer protrudes beyond an end of the beam structure by a predetermined length.

2. The air-gap type FBAR of claim 1, wherein the beam structure is formed above the air gap portion with respect to a vertical virtual surface extending from a gap edge of the air gap portion.

3. The air-gap type FBAR of claim 1, wherein the space portion is filled with one of air and SiO2 whose density is lower than the density of a material constituting the upper electrode or the piezoelectric layer.

4. The air-gap type FBAR of claim 1, wherein a width of the one end of the beam structure in contact with the piezoelectric layer is 50 nm to 200 nm.

5. The air-gap type FBAR of claim 4, wherein a height of the space portion is equal to or less than ½ of a thickness of the upper electrode and a width of a horizontal width of the space portion is 1 μm to 5 μm.

6. The air-gap type FBAR of claim 1, further comprising a conductive metal pattern layer deposited at a position a predetermined distance apart from the one end of the beam structure.

7. The air-gap type FBAR of claim 1, wherein a structure groove is formed on a lower surface of the beam structure that corresponds to an upper portion of the space portion.

8. The air-gap type FBAR of claim 1, wherein a piezoelectric groove is formed on an upper surface of the piezoelectric layer that corresponds to a lower portion of the space portion.

9. The air-gap type FBAR of claim 1, wherein a lower portion of the space portion comprises a tilted portion of an upper surface of the piezoelectric layer.

10. The air-gap type FBAR of claim 9, wherein a lower electrode edge corresponding to one end of the lower electrode is positioned inside an upper surface of the air gap portion.

11. An air-gap type film bulk acoustic resonator (FBAR) comprising:
    a substrate comprising an air gap portion on an upper surface thereof;
    a lower electrode formed on the substrate;

a piezoelectric layer formed on the lower electrode;
an upper electrode formed on the piezoelectric layer; and
a beam structure extending in a dome-shape from one side of the upper electrode to define a space portion between the upper electrode and the piezoelectric layer,
wherein one end of the beam structure is in direct contact with the piezoelectric layer,
wherein the one end comprises a first end in contact with an upper surface of the piezoelectric layer by a predetermined width and a second end extending in a diagonal direction from the first end and spaced apart from the upper surface of the piezoelectric layer.

12. The air-gap type FBAR of claim 11, wherein the beam structure is formed above the air gap portion with respect to a vertical virtual surface extending from a gap edge of the air gap portion.

13. The air-gap type FBAR of claim 11, wherein the space portion is filled with one of air and SiO2 whose density is lower than the density of a material constituting the upper electrode or the piezoelectric layer.

14. The air-gap type FBAR of claim 11, wherein a shape of a side surface of the one end of the beam structure is either a V-like shape or a U-like shape.

* * * * *